(12) United States Patent
Takahashi

(10) Patent No.: US 8,582,383 B2
(45) Date of Patent: Nov. 12, 2013

(54) SEMICONDUCTOR MEMORY DEVICE WITH HIDDEN REFRESH AND METHOD FOR CONTROLLING THE SAME

(75) Inventor: Hiroyuki Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 262 days.

(21) Appl. No.: 13/070,034

(22) Filed: Mar. 23, 2011

(65) Prior Publication Data

US 2011/0255360 A1 Oct. 20, 2011

(30) Foreign Application Priority Data

Apr. 15, 2010 (JP) ................................. 2010-094290

(51) Int. Cl.
*G11C 7/00* (2006.01)

(52) U.S. Cl.
USPC ...... 365/222; 365/149; 365/219; 365/230.09; 365/233.1

(58) Field of Classification Search
USPC .................. 365/149, 219, 22, 230.09, 233.12
See application file for complete search history.

(56) References Cited

U.S. PATENT DOCUMENTS

| | | |
|---|---|---|
| 5,875,452 A | 2/1999 | Katayama et al. |
| 6,421,292 B1 | 7/2002 | Kitamoto et al. |
| 6,597,615 B2 | 7/2003 | Mizugaki |
| 6,744,684 B2 | 6/2004 | Arimoto et al. |
| 6,813,212 B2 | 11/2004 | Takahashi et al. |
| 6,847,570 B2 | 1/2005 | Fujioka et al. |
| 6,909,658 B2 | 6/2005 | Arimoto et al. |
| 7,313,047 B2 | 12/2007 | Kim |
| 7,568,146 B2 | 7/2009 | Takahashi et al. |
| 7,869,796 B2 | 1/2011 | Kim |
| 2004/0205426 A1* | 10/2004 | Muranaka et al. ............ 714/704 |
| 2005/0152201 A1* | 7/2005 | Takahashi ..................... 365/222 |
| 2005/0219930 A1* | 10/2005 | Takahashi et al. ............ 365/222 |
| 2006/0114735 A1* | 6/2006 | Takahashi ..................... 365/222 |

FOREIGN PATENT DOCUMENTS

| | | |
|---|---|---|
| JP | 9-91206 A | 4/1997 |
| JP | 9-180437 A | 7/1997 |
| JP | 2001-357670 A | 12/2001 |
| JP | 2002-74945 A | 3/2002 |
| JP | 2002-170384 A | 6/2002 |
| JP | 2002-184174 A | 6/2002 |
| JP | 2004-005780 A | 1/2004 |
| JP | 2006-190425 A | 7/2006 |
| JP | 2007-226934 A | 9/2007 |

OTHER PUBLICATIONS

Office Action in JP Application No. 2010-094290 with English translation: issued Sep. 10, 2013; 10 pages.

\* cited by examiner

*Primary Examiner* — Hoai V Ho
(74) *Attorney, Agent, or Firm* — Foley & Lardner LLP

(57) ABSTRACT

A semiconductor memory device includes a memory cell array having plural memory cells that require a refresh operation when retaining data; a read/write control unit that performs read-access or write-access of memory cell address specified for the memory cell array based on instructions from the outside; a refresh control unit that performs hidden-refresh of memory cells without control from the outside; and a schedule control unit that makes the refresh control unit perform hidden-refresh after the read/write control unit read-accesses the memory cell array, and that also makes the refresh control unit perform hidden-refresh before the read/write access control unit performs write-access.

16 Claims, 10 Drawing Sheets

SEMICONDUCTOR MEMORY DEVICE WITH HIDDEN REFRESH AND METHOD FOR CONTROLLING THE SAME

CROSS-REFERENCE TO RELATED APPLICATIONS

The disclosure of Japanese Patent Application No. 2010-94290 filed on Apr. 15, 2010 including the specification, drawings and abstract is incorporated herein by reference in its entirety.

BACKGROUND

The present invention relates to a semiconductor device and a control method for the semiconductor device. The present invention relates in particular to a semiconductor memory device including memory cells and a control method not requiring external control of refresh operation when performing hidden-refresh on memory cells in the semiconductor memory device that require refresh operation in order to retain data such as DRAM data.

In recent years, the logic circuit scale in system LSI is becoming increasingly larger to keep pace with more sophisticated system performance. The larger circuit scale in turn, requires a large capacity memory within the system LSI so that there are an increasing number of system LSIs which contain internal DRAM macros.

In contrast to memories such as SRAM that do not require refresh, using memories such as DRAM that require refresh in order to retain memories have the following issues. A first issue is that a memory controller is required in order to regulate the memory refresh. A second issue is that performance deteriorates due to long data access times caused by refresh period interrupts. A third issue is that using plural memory banks requires limiting bank allocation so that full random access is impossible. The above issues must therefore be resolved.

To resolve these problems, DRAM devices are being developed on a practical level to internally control the refresh in an operation hidden from the outside.

Japanese Patent Application Publication No. 2001-357670 describes as a first technology of the related art, a DRAM memory circuit with hidden-refresh operation. Here, an internal timer within the memory measures the time required for retaining data in the memory cell by refresh operation, and generates a refresh request at each required period in order to activate an internal sense amplifier or word line of an internal memory core. The operation when an access request from outside the memory conflicts with this refresh operation (so-called butting) is described. First of all, when an external access request for read or write operation was sent during the internal refresh operation, that external access request is temporarily buffered, and the read or write operation executed according to the external access request after the refresh operation was completed. Also, if the internal timer generated a refresh request while executing read or write, then that refresh request is temporarily buffered, and the refresh operation is then executed after the external access operation (read or write) was completed. Activating the memory core unit in this way, prevents butting (conflicts) between external access and refresh operation by utilizing an arbiter circuit that gives priority to the preceding operation.

Japanese Patent Application Publication No. 2002-74945 describes as a second technology of the related art, a semiconductor memory device that performs hidden-refresh using a synchronous type DRAM synchronized to operate from an externally supplied clock. The operation timing of the semiconductor memory device performing the hidden-refresh in the synchronous type DRAM performs the hidden-refresh described in Japanese Patent Application Publication No. 2002-74945 is shown in FIG. 9. In FIG. 9, "CLK" is the clock signal externally supplied to the semiconductor memory device, "ADD" is the address externally supplied to the semiconductor memory device, and "COMM" is the command externally supplied to the semiconductor memory device from the outside.

Also, the "timer" is a signal output from the timer for counting the refresh periods. The timer includes an internal oscillator and so can also operate asynchronously from the external clock when the external clock has stopped. The timer output signal transitions to low level when reset; and the timer output signal outputs a high-level output signal upon counting up to the required period for refresh. The device performs refresh operation when the timer output signal transitions to high level, and the timer output signal returns to low level when the refresh operation ends. The "Ref address" is the address for performing refresh. The "RA" denotes a low-state array core activation signal, "SE and Word line" denotes a sense amplifier and word line activation signal, "CA" denotes a column activation signal, and "DBUS" indicates data for the bus between the memory cell array and the external input/output terminals. In FIG. 9, the command COMM input to the DRAM in the t0 through t3 cycle is "NOP, and the memory is in non-select standby state not performing read or write. A time overflow occurs during the t0 cycle and the timer output signal rises to high level. Refresh occurs at the next t1 cycle in response to the rise of this timer output signal. The Ref address output by the refresh address generator circuit at this time is AFC1 and so the AFC1 address is selected to generate a low-state array core activation signal RA, to activate the word line and sense amplifier, and to refresh the memory cell. When the refresh operation is complete, the refresh address generator circuit counts the address up to the Ref address AFC2.

After a fixed amount of time elapses, in the tn cycle, the timer once again overflows and the timer output signal transitions to high level the same as in the t1 cycle. However, the command COMM input in the tn cycle is the write command "WE" and so gives priority to read/write operation rather than the refresh operation. In other words, among refresh operations and read/write requests from the outside, priority is given to read/write request operations from the outside. The RA input via the external address A0 is therefore activated during the tn cycle. The write data D0 input at the same time generates a column activation signal (CA) and the D0 input via the bus is written into the cell. FIG. 9 showed the case where the write command was input during the tn cycle and write operation performed but even in cases where the read command was input during the tn cycle, priority is given to read operation rather than refresh operation, and the refresh operation executed during the CLK cycle after finishing these externally requested operations. In these synchronous type circuits, the trigger that starts DRAM core operation in each cycle is the CLK edge (pulse), and the read, write and refresh operations are configured so as to complete within one cycle. Active operation supports two-cycle specifications so hidden-refresh can be performed. In other words, read and write operations initiated from the outside appear to usually require two cycles, but internally initiated read and write operations effectively end within one cycle period. Refresh can be performed within the remaining one cycle so there is no need to be aware that a refresh cycle is externally initiated and hidden-refresh can be executed.

The cycle time required in active read or write operation can be expressed by the following (operation time) formula (I) even assuming specifications for achieving full random access operation such as in SRAM devices even with either of the related art technology in Japanese Patent Application Publication No. 2001-357670 and Japanese Patent Application Publication No. 2002-74945.

Operation cycle time=(read or write operation time)+
(refresh operation time)    formula (1)

SUMMARY

The present invention was rendered in consideration of the following points. Low power usage has become a critical issue in recent LSI systems and there is also a growing need for lower power supply voltages and lower current even in internal memories. Internal memories in LSI systems in particular do not require an interface circuit with sections outside the chip, so utilizing large bit-data specifications is difficult in many cases due to limits on the number of terminals for stand-alone memory packages. In these type memories using large bit-data specifications, there are a large number of bits for making simultaneous inputs and outputs so the power consumption needed for data inputs and output tends to be large.

Moreover, due to the trend toward improved transistor performance in logic LSI, the circuit miniaturization and use of lower power supply voltages is proceeding at a pace faster than in stand-alone memory products. Memory cells are easily susceptible to effects such as from software errors and fluctuations in hold (data retention) characteristics which tend to badly affect the stability of memory cell data retention. Due to these circumstances, use of ECC (error check and correct) was considered to improve memory cell reliability. However, semiconductor memory devices of the related art require ECC encoding and decoding cycles and therefore increase the number of cycles effectively required for write operation and read operation.

A semiconductor memory device according to a first aspect of the present invention includes: a memory cell array having plural memory cells required for refresh to retain data; a read/write control unit that read-accesses or write-accesses the memory cell addresses of a memory cell array specified based on external instructions; a refresh control unit that performs hidden-refresh of the memory cells without external control; and a schedule control unit that makes the refresh control unit perform hidden-refresh after the read/write control unit has read-accessed the memory cell array, and that also makes the refresh control unit perform hidden-refresh before the read/write access control unit performs write access.

A semiconductor device according to a second aspect of the present invention includes: a semiconductor memory device; a data processing device that performs data processing by utilizing data stored in the semiconductor memory device; and the read/write control unit performs read-access or write-access based on instructions from the data processing device; and the refresh control unit performs hidden-refresh with no control from the data processing device.

A control method for a semiconductor memory device according to a third aspect of the present invention, in the semiconductor memory device including a DRAM cell array having a hidden-refresh function based on an internal timer, comprises: performing hidden-refresh after performing data read when there were overlapping hidden-refresh and data read requests from the outside; and performing data write after performing hidden-refresh when there were overlapping hidden-refresh and data write requests from the outside.

The present invention controls operation so as to perform hidden-refresh after read-accessing a memory cell array, and moreover performs hidden-refresh before write-accessing a memory cell array and so is capable of performing ECC encoding and decoding and/or low-energy consumption data input/output in parallel with hidden-refresh.

DETAILED DESCRIPTION

Figure 1:
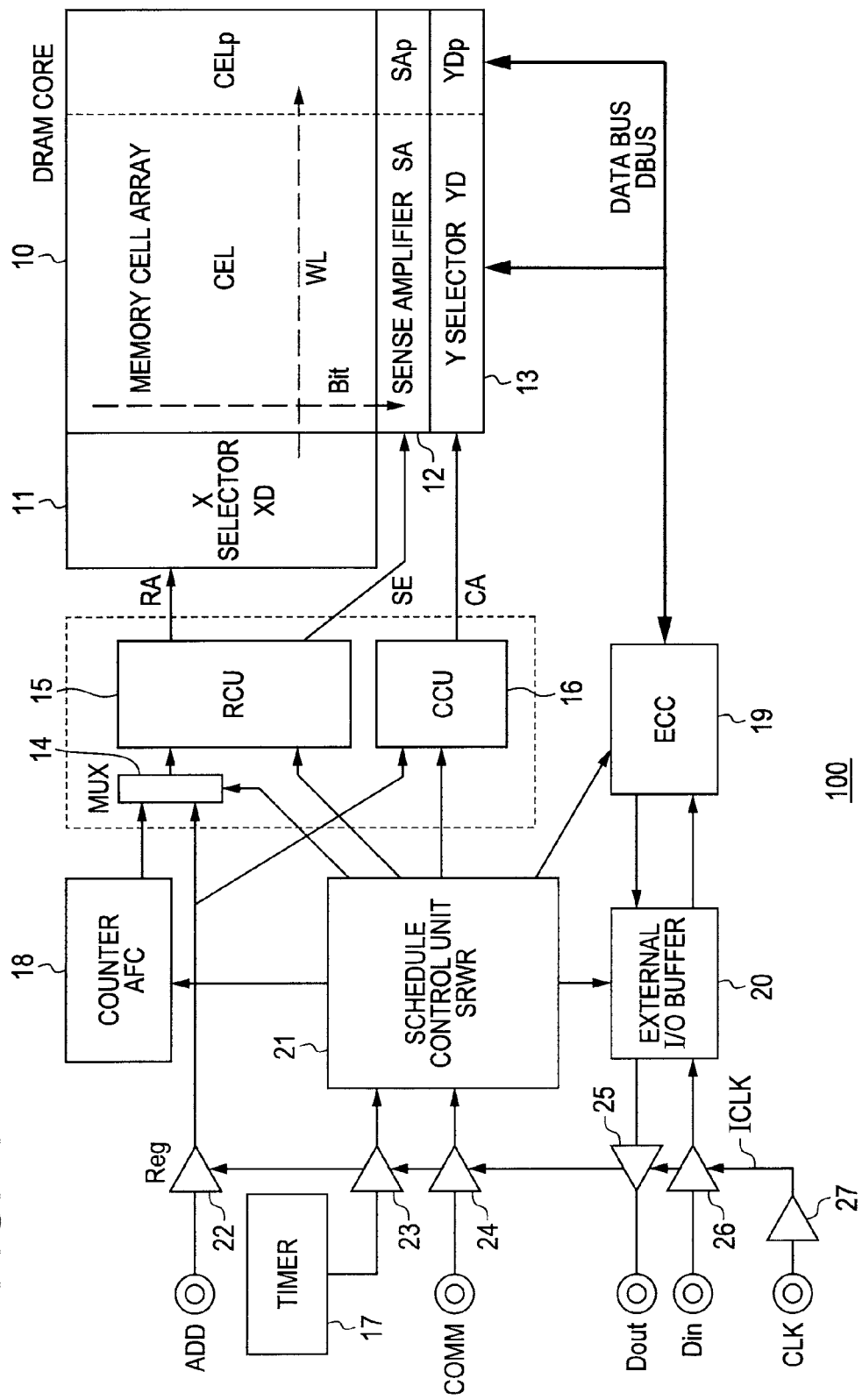
FIG. 1 is a block diagram of the semiconductor memory device of the first embodiment of the present invention.

In the semiconductor memory device of the present invention, among the read and write operations, cycles are grouped into a cycle for accessing the memory cell array itself; and an input/output cycle for converting data that was read into data to output externally, and for converting data input from the outside into write data, and the schedule control unit functions so that hidden-refresh is performed in the input/output cycles. This arrangement allows performing read operations and write operations in parallel with hidden-refresh so that the processing cycles are prevented from becoming long, the memory data is highly reliable, and the power consumption of the data bus is low.

In the above cycle time formula (1), the refresh operation which is one portion of the minimum cycle time, occupies the DRAM core unit (memory cell array and word line selector circuit, sense amplifier, etc.) in a circuit operation that is completely unrelated to the data input/output circuits and bus circuits. If the DRAM core could run data type processing such as ECC processing and low power buses during the period that refresh is occurring, then reliability could be improved and lower power operation achieved without deterioration in cycle performance. So when a refresh operation (hidden-refresh) from an internal timer request, and an active operation (read/write operation) from an external request occur simultaneously, read is executed first if a read request and refresh is executed next. If the request active operation was a write request then refresh is executed first, and write is executed next. Moreover, data type added value processing is executed in parallel with the refresh operation. The schedule control unit controls these multiple linked operation sequences with separate commands.

The embodiments of the present invention are described next in detail while referring to the drawings.

First Embodiment

FIG. 1 is a block diagram of the semiconductor memory device of the first embodiment. The memory cell array 10 in FIG. 1 is plates arranged in arrays and in which a memory cell CEL for storing the data itself, and a CELp for storing the ECC (Error Check and Correct) codes of data for storage in the memory cell CEL are arranged in a matrix. The memory cell CEL and CELp are arranged in matrices corresponding to intersections of multiple word lines WL to simultaneously specify CEL and CELp; and multiple bit lines Bit to specify the respective memory cells CEL and CELp. The drawing only shows the direction that the word lines WL and bit lines Bit are wired. The word lines, bit lines and memory cells themselves are omitted from the drawing however in actual use multiple word lines and multiple bit lines are wired intersecting each other, and memory cells CEL and CELp are formed at the corresponding intersections.

A word line selector circuit (X address selector circuit) 11 selects the word line WL for access from the multiple word lines WL. The sense amplifier 12 amplifies the memory cell CEL, CELp data read out via the bit line Bit. The sense amplifier 12 contains a sense amplifier SA coupled via the bit line Bit to the memory cell CEL; and contains a sense amplifier SAp coupled via the bit line Bit to the memory cell CELp used for ECC. A column selector circuit (Y address selector circuit) 13 couples the selected bit line Bit and the data bus DBUS via the sense amplifier 12.

A clock driver 27 serving as the internal drive buffer forms the external clock signal CLK into an internal clock ICLK. The clock driver 27 inputs this internal CLK as a synchronizing signal into the I/O signal synchronizing registers 22-26. The I/O signal contains an address signal ADD, a command signal COMM for setting memory operating states such as read/write, a write data input signal Din, and a read data output signal Dout. The synchronizing registers 22-26 synchronize the I/O signal to the external clock signal CLK.

A row address generating counter circuit 18 for internal refresh outputs a count value AFC to the multiplexer 14. The counter circuit 18 is an address counter for counting all row addresses of memory cell array 10 in the semiconductor memory device 100. The row addresses are specified in sequence based on the count values from the counter circuit 18, and the memory cell data in the memory cell array 10 can be retained by refreshing the memory cells in memory cell array 10. The multiplexer 14 selects the output signal AFC of counter circuit 18 and the row address output by the address input register 22 and outputs the output signal AFC and row address to the row control unit (RCU) 15. The row control unit 15 outputs a row array core activation signal RA to the word line selector circuit 11 and activates the row address XD. The row control unit 15 also outputs a sense amplifier enable signal SE to the sense amplifier 12, and activates the SA and SAp. The address input register 22 synchronizes the external address signal ADD to the clock signal CLK, and couples the column address among those signals to the column control unit (CCU) 16. The column control unit 16 output the column activation signal CA to the column selector circuit 13. The column selector circuit 13 selects the column based on the specified column address.

An external I/O buffer (input/output data control circuit) 20 couples the write data input signal Din and the read data output signal Dout to an ECC circuit 19. A data bus DBUS couples the ECC circuit 19 to the column selector circuit 13. During write operation, the ECC circuit 19 attaches an ECC code to the write data input signal that was input externally and outputs that signal to the data bus DBUS; and during read operation utilizes the ECC code on the data read out from the memory cell array 10 to check and make corrections to the read-out data and outputs that data to the external I/O buffer 20.

The output signal from the refresh period time measurement timer 17 and the command signal COMM synchronized by the internal clock ILCK are both input to the schedule control (SRWR) unit 21 that adjusts the read/write operation and the refresh operation.

When a hidden-refresh request based on an output signal from timer 17 for memory cell array 10 overlaps (conflicts with) a read/write access request based on the command signal COMM, the schedule control (SRWR) unit 21 performs scheduling so that the computation processing by the ECC circuit 19 that accompanies read/write operation can be performed in parallel with the hidden-refresh. In the semiconductor memory device 100, the schedule control unit 21 regulates the read/write control unit that controls read/write access based on instructions from the outside, and the refresh control unit that controls the hidden-refresh, exercising control so that there are no conflicts between read/write operation and hidden-refresh operation. The schedule control unit 21 may be composed of a sequencer.

Figure 10:
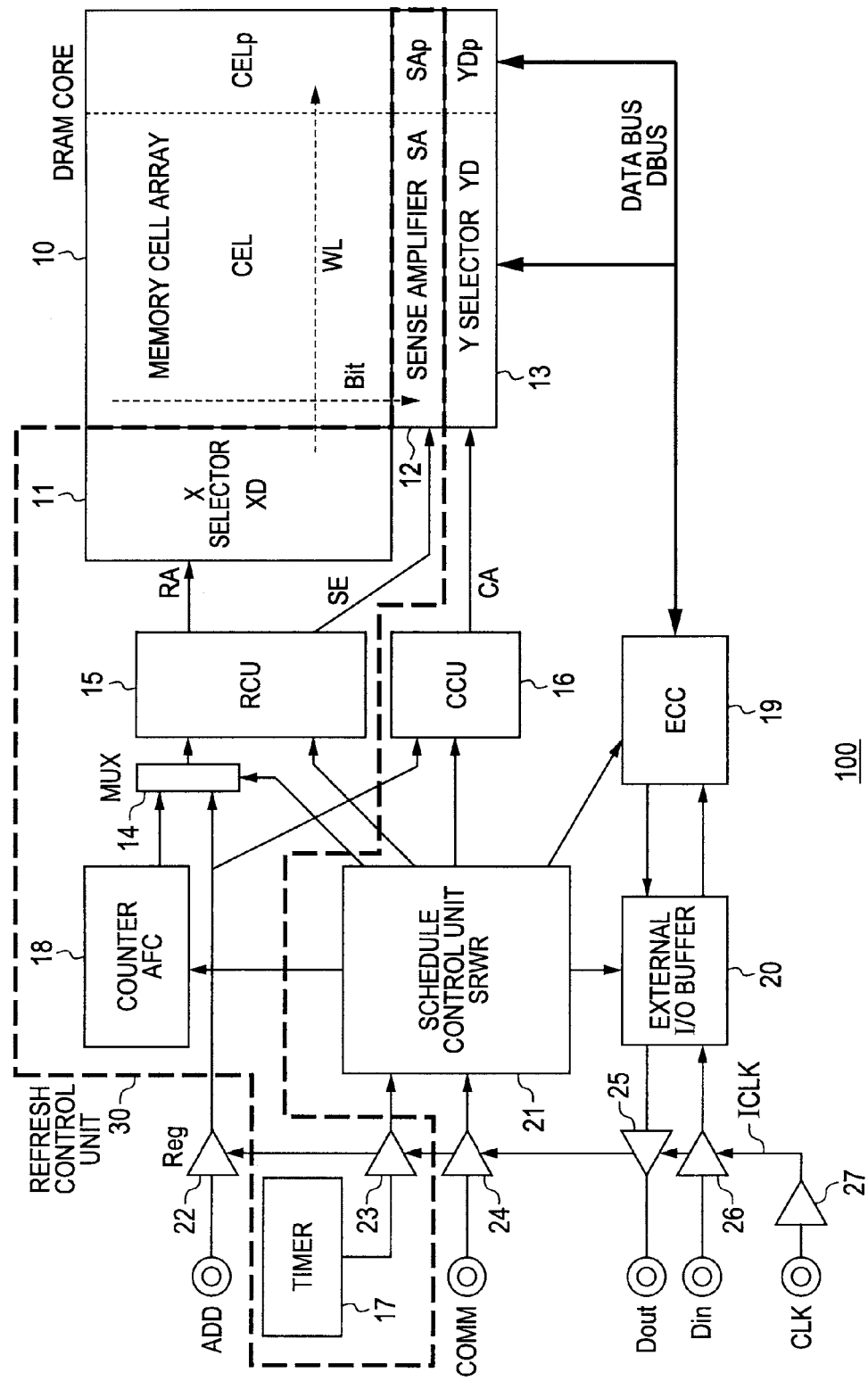
FIG. 10 is a block diagram showing the structure of the refresh control unit in the semiconductor memory device of the first embodiment.

In the structure of the semiconductor memory device 100 in FIG. 1, the refresh control unit 30 is shown by the broken line in FIG. 10. The refresh control unit 30 in FIG. 10 contains a timer 17, a timer input register 23, a counter 18, a multiplexer 14, a row control unit 15, a word line selector circuit 11, and a sense amplifier 12. In the structure of the refresh control unit 30, the multiplexer 14, a row control unit 15, a word line selector circuit 11, and a sense amplifier 12 are also utilized in the read/write control unit, and utilized in both the refresh operation and the read operations. The read/write control unit is structured for use only in the read/write operation in the column control unit 16, the ECC circuit 19, and the external I/O buffer 20 and does not contain circuits for use in the refresh operation.

Figure 2:
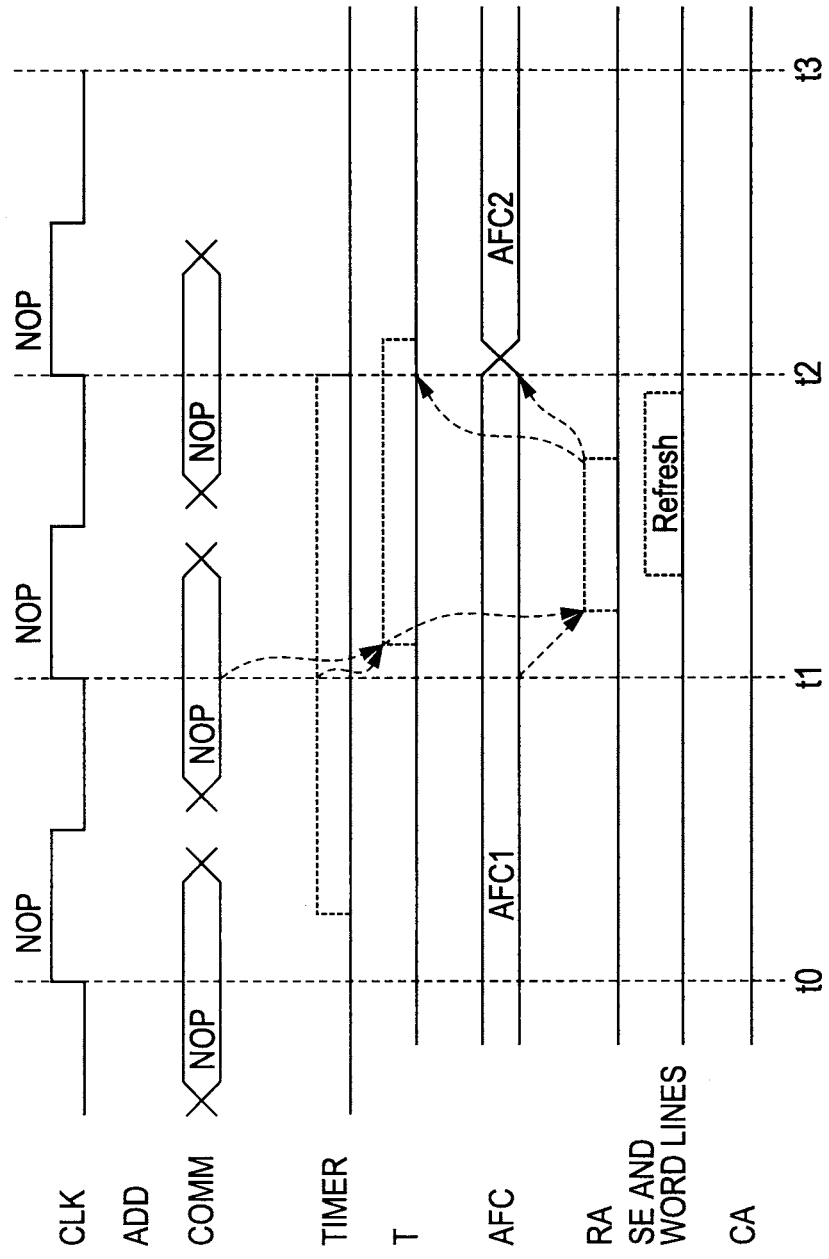
FIG. 2 is an operation waveform chart of the standby state in the semiconductor memory device of the first embodiment.

The operation of the first embodiment is described next. FIG. 2 is an operation waveform chart of the standby (memory non-select: NOP) state in the semiconductor memory device of the first embodiment. In FIG. 2, "CLK" indicates the external clock signal, "COMM" indicates the command signal, "Timer" indicates the output signal from the timer 17, "T" indicates the timer output signal synchronized to the clock CLK by the timer input register 23, "AFC" indicates the count value of the counter 18, "RA" indicates the row array core activation signal, "SE and Word line" indicates the states of the sense amplifier and the word line and "CA" indicates the column activation signal. The dotted line in FIG. 2 indicates the state where refresh is activated.

The clock signal CLK rises at the timing t0 and the first cycle begins. The timer 17 overflows during this first cycle period (from timing t0 to timing t1) and the timer output signal transitions to high level. At the second cycle that is started by the clock signal CLK rising at timing t1, the timer output signal is input into the timer input register 23 at the rise of the clock signal CLK and then input into the schedule control unit 21. In the second cycle, the command signal COMM serves as the memory non-select state NOP (or standby), so the schedule control unit 21 sends an instruction to each control circuit to execute refresh operation. Column and data circuits (such as the column control circuit 16, ECC circuit 19, external I/O buffer 20) contained in the read/write control units but not in the refresh control unit 30 are in the stop state, however row control circuits (such as row control unit 15, etc.) within the refresh control unit 30 are activated regardless of whether contained in read/write control unit or not. The word line selector circuit 11 selects the word line, and the row address is selected according to the count value AFC of counter 18 to serve as the refresh address. The cell coupled to the selected word line executes the refresh operation by rewriting the cell data via each bit line by the sense amplifiers 12 (SA, SAp) activated by the sense amplifier enable signal SE. This refresh operation ends in one cycle that started with the refresh operation timing t1, so the next command can be input in the next state in which third cycle that starts from the timing t2. The refresh request signal is simultaneously canceled at timing t2, and the counter 18 counts up from count value AFC1 to AFC2. The DRAM core as shown by the solid line in FIG. 2 is then not activated in the period where no refresh request is issued.

Figure 3:
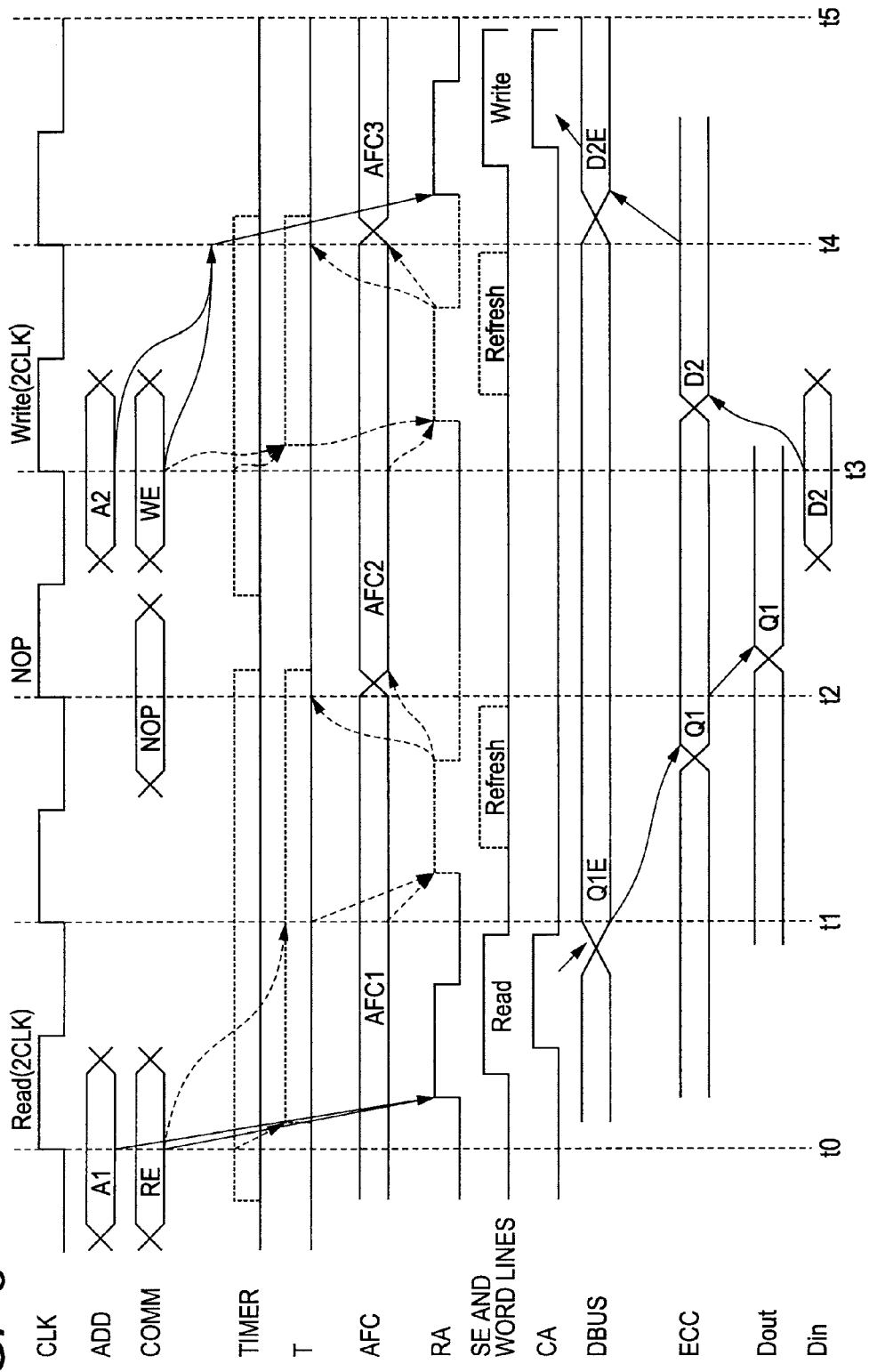
FIG. 3 is an operation waveform chart of the active state in the semiconductor memory device of the first embodiment.

Next, FIG. 3 shows an operation waveform chart of the active state in the semiconductor memory device of the first embodiment. The command signal COMM and the address signal ADD are input at the clock signal CLK edge pulse timing t0 during the first cycle that started at the clock signal CLK pulse rise timing t0. The command signal COMM is the read state (RE) so the multiplexer MUX selects the external address A1. The row array core activation signal (pulse) RA rises at the read state (RE) from command signal COMM. Moreover the word line selector circuit 11 selects the word line based on the row address for the external address A1, and also activates the sense amplifier 12. The sense amplifier SA amplifies the memory cell CEL data read out from the bit line by selecting the word line. Further, when the column activation signal CA is activated and rises to high level, the data amplified by the sense amplifier SA on the selected bit line is output to the data bus DBUS as the data Q1E. The ECC code which is data read out from the memory cell CELp via the bit line, is amplified by the sense amplifier SAp and output via YDp to the data bus DBUS. In the example in FIG. 3, the read operation cycle is a dual cycle operation from timing t0 to the timing t2. In the next clock cycle starting from timing t1, the ECC circuit 19 combines the Q1E signal with the parity bit data to perform error correction processing. Further, at the cycle starting from the next timing t2, the error corrected data Q1 is output via the external I/O buffer 20 as the data output signal Dout.

Here the dotted lines show the case where a refresh request was sent from the timer just before the read command was input at timing t0. The timer input register 23 synchronizes the output signal from the timer serving as the refresh request signal with the external clock signal CLK which is then the synchronized request signal T. The (pulse) rise timing (immediately after timing t0) of this synchronized request signal T overlaps the first cycle (timing t0-t1) of the DRAM core activation in the read operation that is based on the read command input at timing t0, so the schedule control unit 21 performs scheduling so as to perform refresh operation in the second cycle of the read command (timing t1-t2). The row array core activation signal RA is then activated in synchronization with the second clock cycle based on the read command started from the timing t1, and starts the refresh operation. Along with the start of refresh operation, the row address is then selected and the word line and sense amplifier are activated based on the count value AFC1 of the counter 18. The sense amplifier then amplifies the data read out from the memory cell via the bit line to the sense amplifier and then restores the data to the original memory cell via the bit line again. The row array core activation signal RA is activated in the refresh operation but the column activation signal CA is not activated. After refresh is completed, the timer request is returned to the off state, and the refresh address counts up to AFC2.

In the fourth cycle that starts at the rise of the external clock signal CLK at timing t3, the external address signal ADD, and the command signal COMM at the rising edge of the clock signal CLK are input in the first cycle of the write operation. In this example, the write operation is two cycles. In write status (WE), the external address A2 is held until the next cycle (timing t4-t5), and the row array core activation signal RA, the sense amplifier enable signal SE, and the column activation signal CA are selected in synchronization with the fifth clock cycle (timing t4-t5) and writing onto the DRAM core performed. The data for writing is input as D2 from the write data input signal Din in the fourth cycle (timing t3-t4) and encoding performed for generating ECC parity (bits) in this fourth cycle (timing t3-t4), and the data D2E which is data D2 with ECC code attached is output to the DBUS. This dataD2E with ECC code attached becomes write data in the next fifth cycle (timing t4-t5).

The dotted line in the figure shows the case where a refresh request was sent from the timer immediately prior (just before the timing t3) to input of the write command. The rise of the request signal T which is the refresh request signal from the timer synchronized with the external clock, overlaps on the command input timing of the write command WE at the rise of the external clock signal CLK in the fourth cycle (timing t3). However, the activating of the memory cell array 10 based on the write command WE is scheduled for the next fifth cycle (timing t4-t5) so that refresh operation is performed in the fourth cycle (timing t3-t4). In other words, after detecting the rise of the refresh request signal T in the fourth cycle (timing t3-t4), the multiplexer 14 selects the output signal AFC sent from the counter 18, and also promptly activates just the row array core activation signal RA (column activation signal CA is not activated), and along with selecting a word line based on the refresh address AFC2, activates the sense amplifier 12 via the sense amplifier enable signal SE and refreshes the cell data. After completing the refresh of the cell data, the timer request returns to the off state and the reference address counts up to AFC3. The refresh operation completes in the fourth cycle and so does not affect scheduling of the fifth cycle write operation.

In the semiconductor memory device of the first embodiment as described above, the schedule control unit 21 is capable of performing in parallel the processes of: hidden-refresh, encoding write operation via the ECC circuit unit, and decoding during the read operation so that the semiconductor memory device can retain data to a high degree of reliability without causing delays in data access due to encoding or decoding by the ECC circuit.

The first embodiment is in other words, a completely random access memory utilizing a memory cell required for refresh when holding memory data such as in a DRAM, and moreover providing two cycles respectively for the read operation and the write operation in order to achieve hidden-refresh achieved by external access without having to worry about a refresh operation, by setting the read operation or the write operation into one cycle and the refresh operation into the remaining cycle and in this way completely separating the read/write and refresh operations by time-sharing. The read operation is here executed in the first cycle during read; and the write operation is executed in the next cycle during write. The refresh operation can be performed in the DRAM core along with simultaneously processing by peripheral circuits that perform ECC decoding of the data read out from the core in the second cycle during read. The refresh operation can be performed in the DRAM core simultaneously with peripheral circuit processing that performs ECC encoding of data to be written in the first cycle during write. This parallel processing is possible because the DRAM core and peripheral circuit functions are each separate from each other due to setting a state where the refresh and the ECC processing are isolated from the column selection section.

The schedule control unit divides up the read, write, refresh, and ECC processing operations over the two cycles. Among the functions of the semiconductor memory circuit 100, the schedule control unit controls the read/write control unit that performs control required for executing read/write operations, and the refresh control unit 30 for executing control required for executing refresh; and also includes functions for setting the circuit operating order in sequences that differ between read and write. The embodiment in this way functions as a fully random access memory with no cycle time overhead from ECC functions while maintaining hidden-refresh functions.

Second Embodiment

Figure 4:
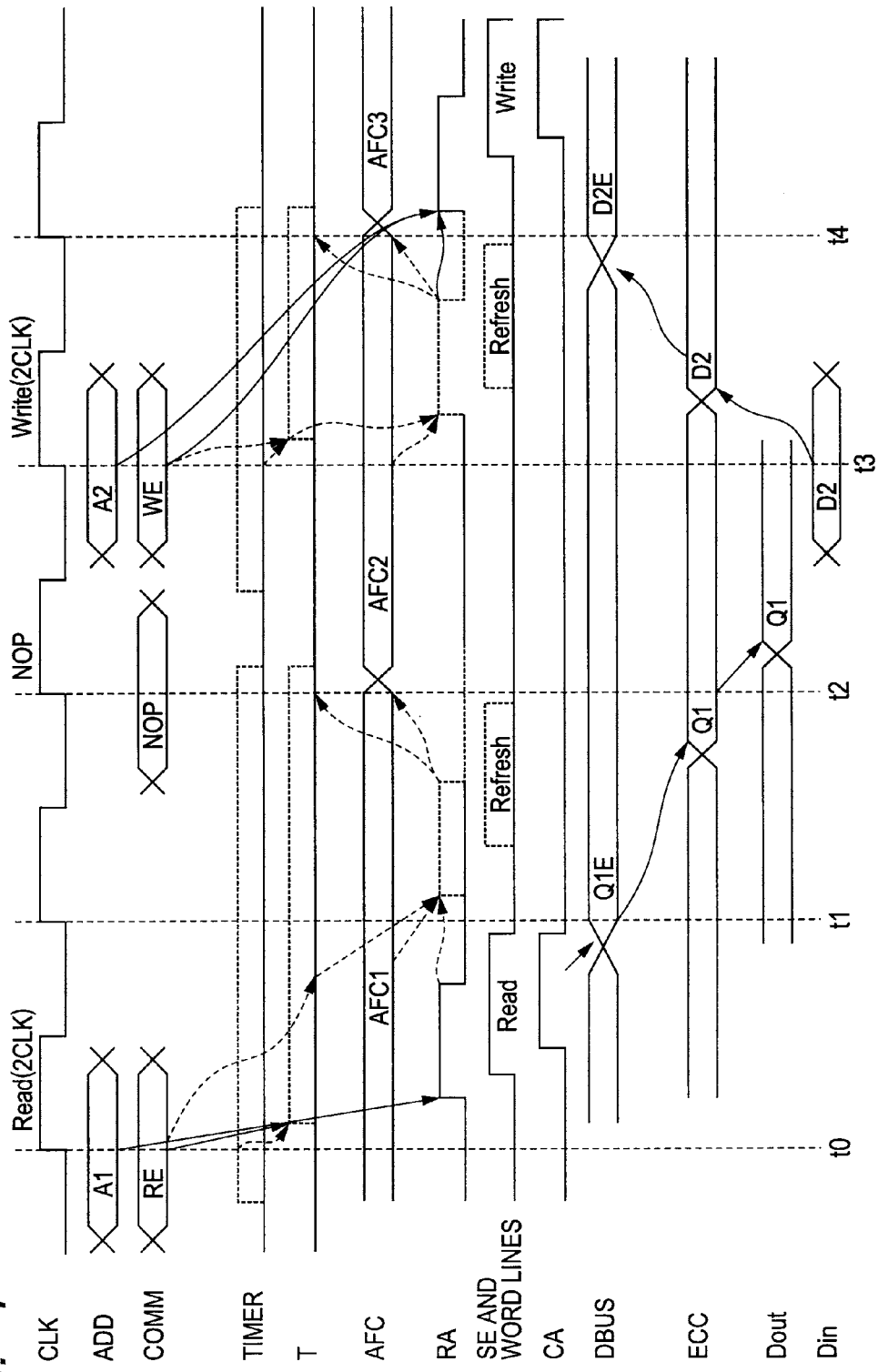
FIG. 4 is an operation waveform chart of the active state in the semiconductor memory device of the second embodiment.

The semiconductor memory device of the second embodiment is described next while referring to the operation waveform chart of the active state in the semiconductor memory device of the second embodiment in FIG. 4. The basic block structure of the second embodiment is identical to the semiconductor memory device 100 of the first embodiment. However the operation timing diagram is different. In the semiconductor memory device of the first embodiment, the respective second clock cycle read/write operation was synchronized with the external clock CLK. In the semiconductor memory device of the second embodiment however, the respective second clock cycle read/write function operations are executed consecutively with each circuit operation in the first cycle. During read, the DRAM core read-out operation is executed in the first cycle starting from timing t0, and the refresh operation is then executed consecutively with the completion of the DRAM core read-out. The data read out from the DBUS in the first cycle is simultaneously input (unchanged) consecutively to the ECC circuit, and the decoded data is sequentially output. The write operation is executed in the same way at the end of the refresh operation starting from timing t3. The external input data from parallel processing is generated by ECC encoding as parity data while refresh is being performed, and is output along the bus and conveyed to the DRAM core. The refresh operation and the ECC processing are not synchronized with the clock signal CLK, and the respective operation timings might reach an overlap state but each is a separate circuit operation so no problem will occur.

In the second embodiment, the circuit operation in the second cycle is started consecutively with the end of the circuit operation in the first cycle and is not synchronized with the external CLK trigger so that the overall cycle time can be shortened and waiting time eliminated.

In the second embodiment, the prior and latter time relation of the read/write operation to the refresh operation need not always be CLK synchronized. If there is a conflict for example between read/write and hidden-refresh, then the operation in the first cycle is performed in synchronization with the external CLK but the operation in the second cycle (refresh operation if there is a conflict between read and refresh; write operation if there is a conflict between write and hidden-refresh) need not always be synchronized with the external CLK and the second cycle operation may be performed following the end of the first cycle operation. Namely, the schedule control unit may control the read/write control unit and the refresh control unit 30 so that non control conflicts occur during read/write operation and refresh operation between the read/write control unit and the refresh control unit 30 among circuits jointly shared by the read/write control unit and the refresh control unit 30 (i.e. row control circuit 15, word line selector circuit 11 and sense amplifier 12). In the case of the read operation for example, after accessing the memory cell array 10 that accompanies the read operation is complete, then control may be performed so that the refresh control unit 30 accesses the memory cell array 10 to perform refresh to allow operation to transition from read operation to refresh operation without synchronizing with the external clock.

In the case of write operation, control may be performed in the same way so as to access the memory cell array 10 that accompanies the write operation after encoding by the ECC circuits and refresh of memory cell array 10 by the refresh control unit 30 are completed. The refresh operation can therefore transition to write operation without synchronizing with the external clock.

Control can further be exerted in the same way between the data input and data output to the DRAM core, and ECC operation. Applying this type of control offers the advantage not only of shortening the overall cycle time but also that a more flexible response can be made to conditions for various specifications relating to the CLK.

Third Embodiment

Figure 5:
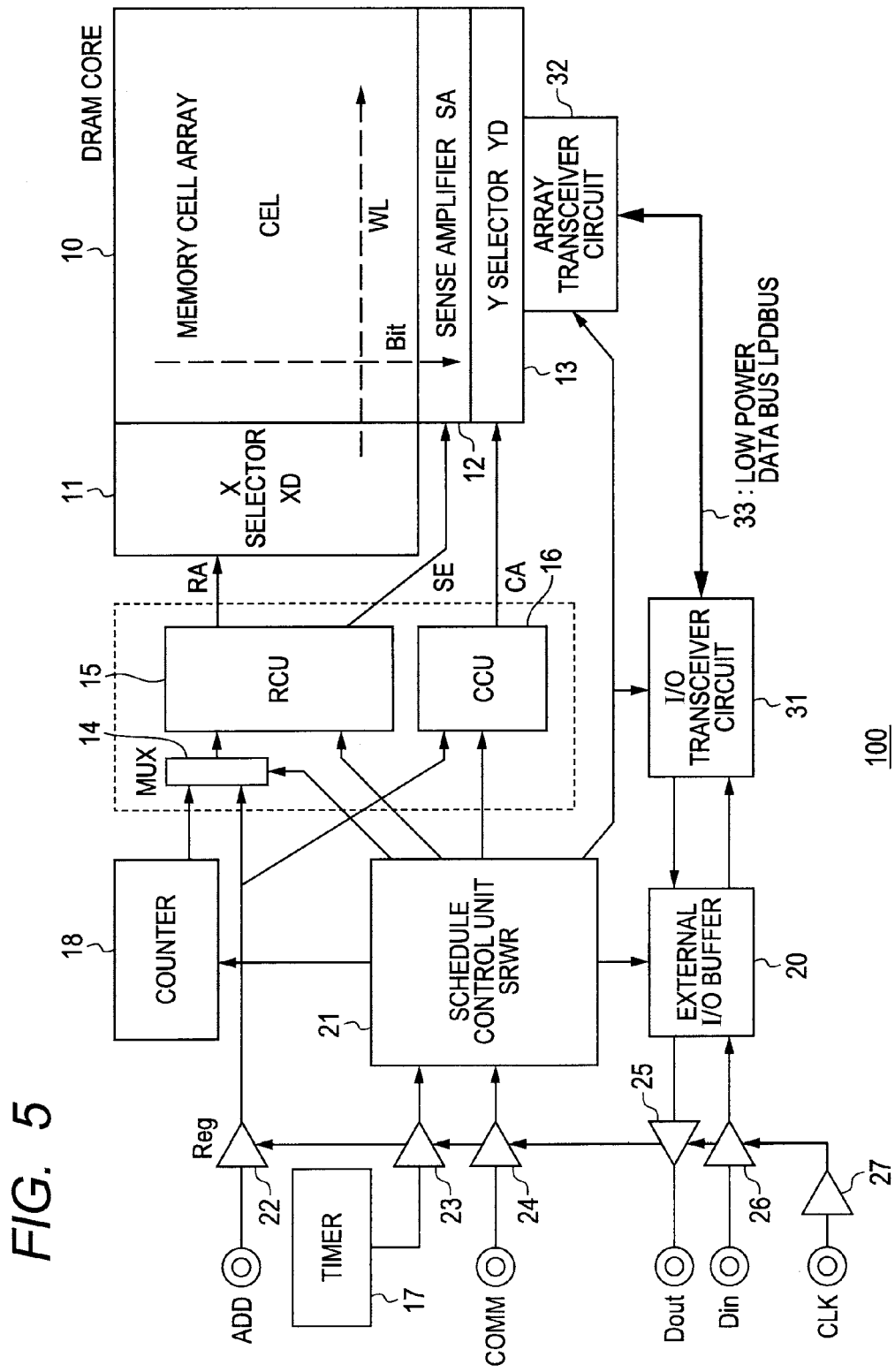
FIG. 5 is a block diagram of the semiconductor memory device of the third embodiment.

FIG. 5 is a block diagram of the semiconductor memory device of the third embodiment. In the structure of the semiconductor memory device 100A shown in FIG. 5, sections whose functions and operation are largely the same as the semiconductor memory device 100 in the first embodiment shown in FIG. 1 are assigned identical reference numerals and redundant descriptions are omitted.

In the semiconductor memory device 100A of FIG. 5, there is no ECC circuit 19, and the data bus DBUS of FIG. 1 has been replaced with the low power data bus LPDBUS 33. An I/O transceiver circuit 31 moreover has been installed between the external I/O buffer 20 and the low power data bus LPDBUS 33; and an array transceiver circuit 32 has been installed between the column selector circuit 13 and the low power data bus LPDBUS 33.

The I/O transceiver circuit 31 converts the large bit data input as the write data input signal Din to the external I/O buffer via the data input receiver into a low power data signal and outputs it to the low power data bus LPDBUS 33. The I/O transceiver circuit 31 also converts the data signal that was converted into a low-power data signal and sent via the low-power data bus LPDBUS 33 from the memory cell array section, into a CMOS level logic signal of the related art and outputs this signal via the external I/O buffer 20 to outside the semiconductor memory device 100A (e.g. data processing device formed over the same semiconductor substrate, see FIG. 8).

The array transceiver circuit 32 converts the large bit data read out from the memory cell array 10 via the sense amplifier 12 and the column selector circuit 13 into a low-power data signal in the same way, and outputs this low-power data signal to the low-power data bus LPDBUS 33. This array transceiver circuit 32 is also a circuit for converting the write data signal sent via the low-power data bus LPDBUS 33 (after conversion to a low-power data signal) into a logic level signal for writing into the memory cell array 10.

There is no ECC circuit 19 installed in the semiconductor memory device 100A of FIG. 5 so the memory cell array 10 contains no memory cell CELp for storing the ECC codes, and the sense amplifier SAp and the column selector circuit YDp used for the CELp are also omitted. In all other respects the structure is largely identical to the semiconductor memory device 100 in FIG. 1.

The operation of semiconductor memory device 100A of the third embodiment shown in FIG. 5 is described next using the active state operation waveform in FIG. 6. The operation of semiconductor memory device 100A of the third embodiment more closely resembles the operation of the semiconductor memory device of the second embodiment shown in FIG. 4 than semiconductor memory device 100 in the first embodiment so the description compares the present embodiment with the operation waveform of the semiconductor memory device of the second embodiment shown in FIG. 4.

Figure 6:
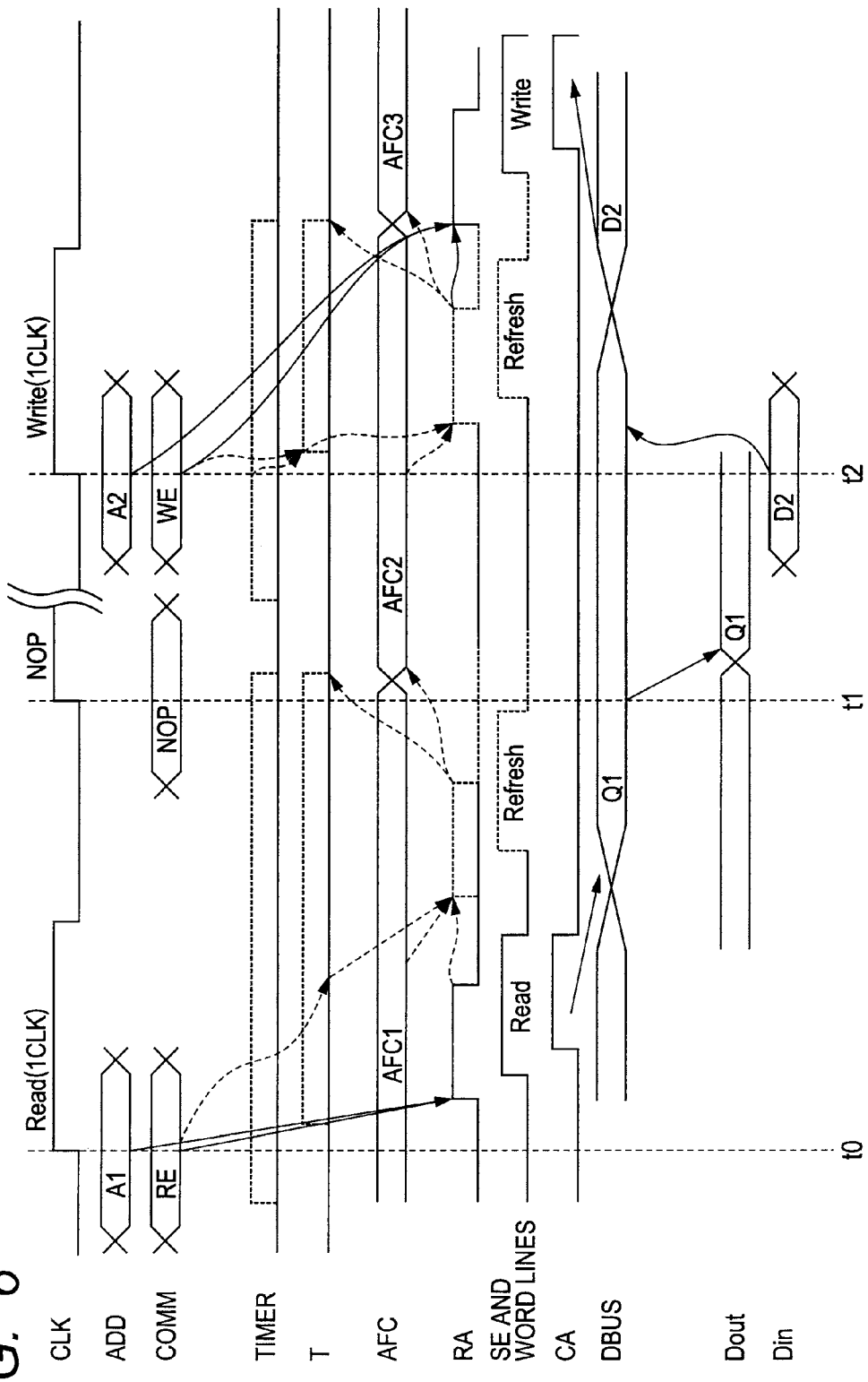
FIG. 6 is an operation waveform chart of the active state in the semiconductor memory device of the third embodiment.

The semiconductor memory device 100A of FIG. 6 executes: read+refresh or refresh+write as a consecutive operation in the internal DRAM core during the external CLK 1 cycle. This operation makes it unnecessary to take into account the inputs spanning the two clocks. The data Q1 read out from the core during the read operation is conveyed along the low-power data bus LPDBUS 33 utilizing the time in which the refresh operation is occurring within the internal DRAM core, and reaches the external I/O buffer 20 and is output as the read data output signal Dout at the next CLK edge trigger. Moreover, the cores is also refreshed in the write operation, and the data D2 is conveyed from the external I/O buffer 20 along the low-power data bus LPDBUS 33 to the DRAM core in the time until the write operation starts. There is an ample time margin in the bus drive time for data transfer in the respective read and write operations so that the low-power circuit can be utilized in that time.

There are numerous examples of lower power technology for bus drive circuits which include: (1) reducing the size of transistors that drive the low-power data bus LPDBUS in the I/O transceiver circuit 31 and the array transceiver circuit 32; (2) narrowing the layout bus wiring width of the low-power data bus LPDBUS; (3) installing a repeater (that is a combination of the above (1) and (2), etc.; (4) arranging the bus signal lines in hierarchical layers to minimize the drive load; (5) reducing the number of data transition bits by utilizing data coding technology; (6) utilizing dedicated drivers and receivers for low-amplitude operation of I/O transceiver circuit 31 and the array transceiver circuit 32 along the bus; and (7) setting the plural value levels on the bus so as to transfer multiple bit data along a one bit data line. These technologies almost without exception include a large bus data transfer speed overhead. The schedule control unit 21 however is capable of performing data transfer from the external I/O buffer 20 to the column select line circuit 13 and hidden-refresh during the write operation, and preparing for data output from the column selector circuit 13 to an external point and hidden-refresh during the write operation, and hidden-refresh operations all in parallel.

The schedule control unit 21 in other words, controls the read/write control units (external I/O buffer 20, I/O transceiver circuit 31, the array transceiver circuit 32, and the column control unit 16, etc.), the refresh control unit (counter 18, etc.) and sections jointly used by the read/write control unit and the refresh control unit (multiplexer 14, row control circuit 15).

The bus drive current consumes the most power in the DRAM overall and so this method (low-power data bus LPD-BUS) is an effective method for achieving low power without a loss in performance in the hidden-refresh DRAM. Moreover, a portion of this low-power technology is effective in lowering the peak current and so also exhibits an effective low-noise effect. Low noise acts to suppress ripple in the power line and so can also prevent enlarging of the sense amplifier operating margin and prevent problems due to noise interference among other adjacent circuits in the DRAM macro. This low-power data bus LPDBUS method also allows reducing or eliminating measures that were taken up to now to increase power and measures to counter noise including enlarging the memory macro-surface area by inserting a stable capacitance between power supplies (decoupling capacitance), increasing the metallic layers and enlarging the wiring width thickness in order to lower the power supply wiring resistance, and reducing the package power supply line inductance, and so on to achieve a cost-cutting effect.

The third embodiment can also be achieved in combination with the first embodiment or the second embodiment. In other words, by performing hidden-refresh after read access, and performing hidden-refresh before write access, the bus power consumption can be lowered and the ECC encoding and decoding can be performed in parallel with hidden-refresh. The write cycle and the read cycle may be contrived to end in one clock cycle, or the write cycle and the read cycle may be contrived so as to require plural clock cycles.

Fourth Embodiment

Figure 7:
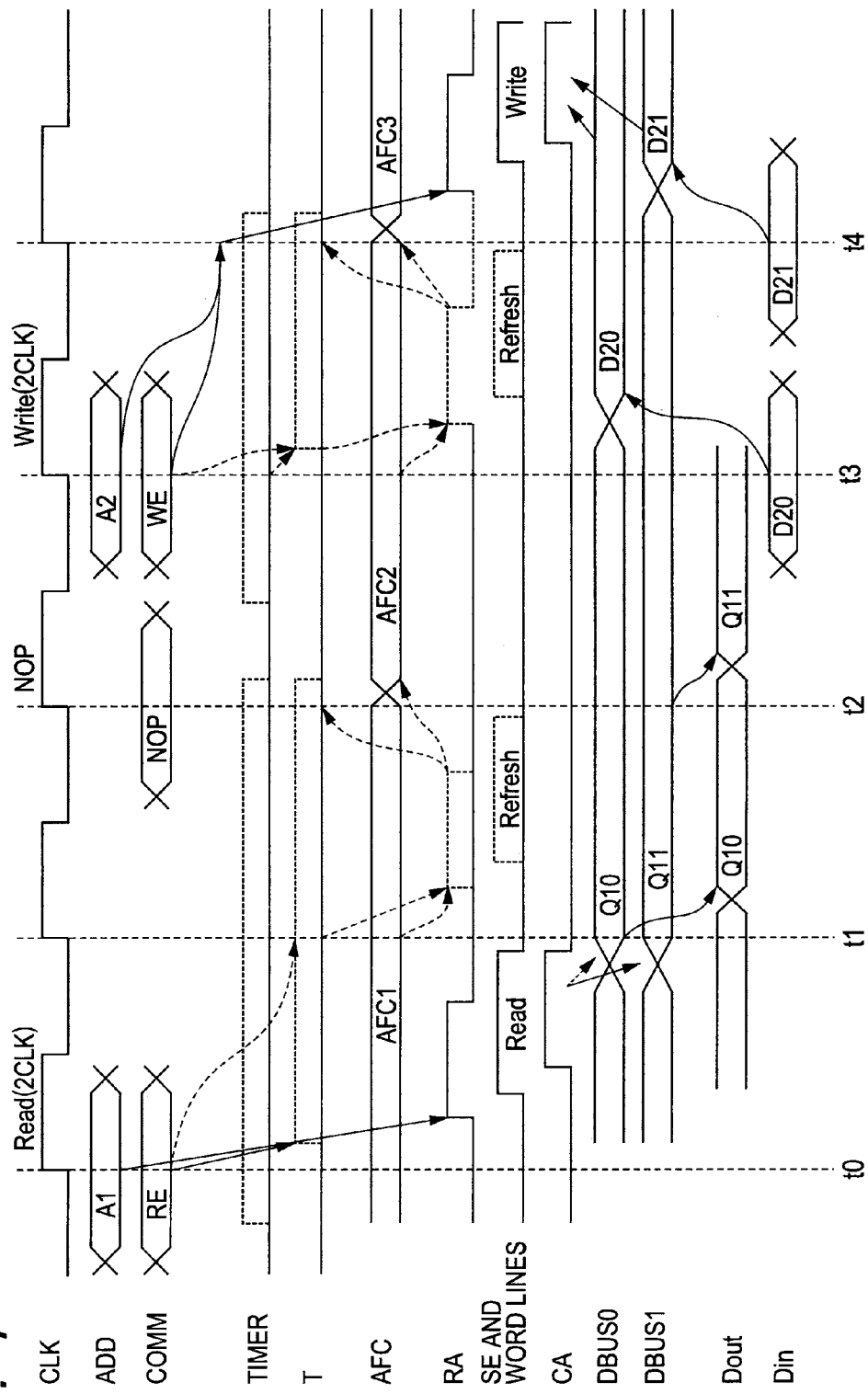
FIG. 7 is an operation waveform chart of the active state in the semiconductor memory device of the fourth embodiment.

FIG. 7 is an operation waveform chart of the active state in the semiconductor memory device of the fourth embodiment. In the fourth embodiment, the external input/output data is serially input and output using burst operation in multiple clock (CLK) cycles. Moreover, a read/write method is utilized for parallel reading or writing of portions of burst data in batches within the internal DRAM core. This figure shows the burst operation on a two-data portion (equivalent to a 1 bit address) of data. In FIG. 7, when the read operation RE is specified as the command signal COMM at timing t0, a two-data portion of data is read out in parallel from the memory cell array 10 in the cycle at t0 timing. This data is then transferred in parallel to the external I/O buffer 20 using the internal parallel buses DBUS0 and DBUS1 in the cycle starting from the next timing t1. The data transferred to the external I/O buffer 20 is converted into serial data, and the data Q10 at the cycle starting from timing t1, and the data Q11 starting from the next cycle starting from timing t2; are output to an external point as read data output signals. Read out of data from the memory cell array 10 at the cycle starting from this timing t1 has already ended so refresh is performed in parallel with the external output of the data Q10.

In the two-data portion of data in the burst-write operation starting from timing t3, the initial (first) write data D20 at timing t3; and the second write data D21 at timing t4 for the two-data portion of write data; are input as the write data input signal Din to the external I/O buffer 20. Refresh is now performed since the input of this write data does not complete within the first cycle starting at this timing t3. The preparation of write data is completed by cycle at the next timing t4, so data write is performed in the memory cell array 10.

The basic DRAM core operations such as read, write, and refresh can be performed so as to correspond to multiple cycles of two or more cycles by speeding up the CLK period for serial input/output of burst data, or making the burst length even longer. Moreover, different types of specifications can be accommodated by providing separate DRAM core and data input/output interface CLK, or by using both the rise and fall edges of the CLK pulse.

In particular when performing burst-read, the data read out in parallel from the memory cell array is output after being converted to serial data so read-access of the memory cell array is performed at the first clock cycle; and in the second cycle the data read out in parallel in the first clock cycle is converted into serial data and is output. Read access of the memory cell array is no longer needed in cycles from the second cycle onward so this cycle can be utilized to perform hidden-refresh.

In the case of burst-write, the data for burst-write is input serially, and the memory cell array is not write-accessed until all data for burst-write is available. Hidden-refresh is performed utilizing the period for gathering this burst-write data, and after finished gathering the data for burst-write, the burst-write data is batch-written onto the memory cell array.

Fifth Embodiment

The fifth embodiment is described next (drawings are omitted). The description of the fifth embodiment assumes usage of Late-Write as the operation for writing onto the DRAM core. Namely, when executing the write command, the write address and data are accumulated at one time into the late-write register rather than being written serially into the memory cell array. Then, when the next write command is given, writing onto the memory cell array is performed based on the data and address provided by the last previous write command accumulated in the write register. Late-Write specifications utilize a high-speed RAM having reduced cycle-loss during read and write switching, and moreover that is not susceptible to limits on specifications such as burst and latency during write data input. In late-write, the write address and data are gathered at the first cycle during write so that writing onto the DRAM core can be performed immediately after a write command even if the burst operation specifications use serial data input. In the present embodiment however, write (late-write) operation is performed after executing the refresh operation first. Performing late-write after the refresh operation renders the benefits of late-write operation simultaneously with the benefits obtained in the first through the fourth embodiments.

Sixth Embodiment

The sixth embodiment is described next (drawings are omitted). In the sixth embodiment, a schedule control unit is defined as an additional custom control macro relative to the macro holding basic DRAM core functions (read, write, and refresh), and a hidden-refresh DRAM via an upper hierarchy wrapping containing these macros. In the circuit in FIG. 1 for example, a schedule control unit 21, a timer 17, an ECC circuit 19, and an I/O buffer circuit and so on are loaded into a dedicated control macro other than the DRAM basic core (memory cell array 10, word line selector circuit 11, sense amplifier 12, and column selector circuit 13, etc.) in order to operate the basic macro in the DRAM core through this dedicated control macro. This arrangement allows efficiently developing the memory of this invention by designing just the dedicated control macro section and utilizing an already existing DRAM basic core unchanged. Mounting a macro internally into a system LSI allows utilizing that dedicated control macro in an automated design environment the same as the other logic units so that along with further cutting the design TAT (turnaround time), a software macro is essentially created so there is greater layout freedom which contributes to shrinking the overall surface area of the chip.

In other words, by developing a DRAM basic macro (memory cell array 10, word line selector circuit 11, sense amplifier 12, and column selector circuit 13, etc.) as a circuit jointly used by multiple semiconductor memory devices, and a dedicated control macro (schedule control unit 21, timer 17, ECC circuit 19, I/O buffer circuit, low-power data bus LPD-BUS 33, I/O transceiver circuit 31, and array transceiver circuit 32, etc.) with a circuit configuration matching the unique specifications of a number of individual semiconductor memory devices, then multiple semiconductor memory devices possessing different specifications can be efficiently developed to function overall as a refresh DRAM via a schedule control unit 21.

Seventh Embodiment

Figure 8:
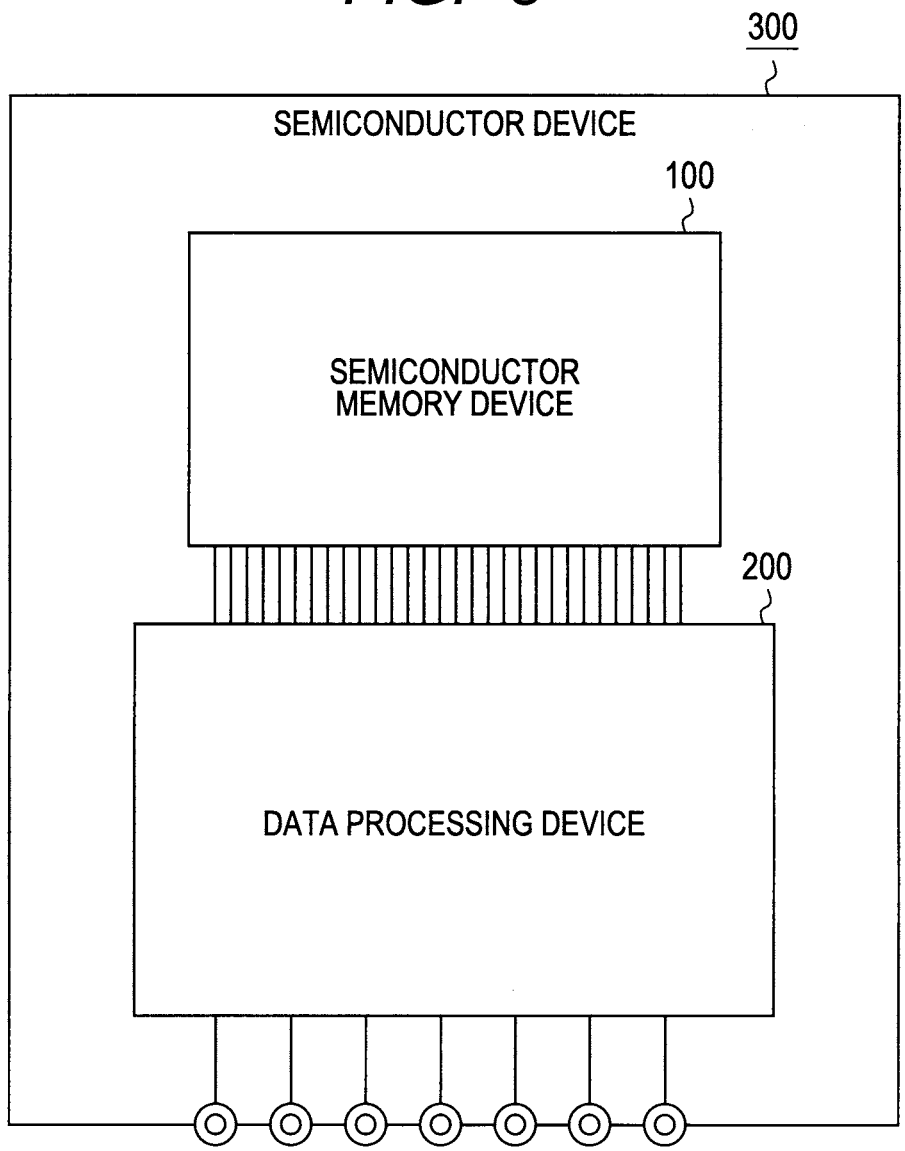
FIG. 8 is a block diagram of the semiconductor memory device of the seventh embodiment.
Figure 9:
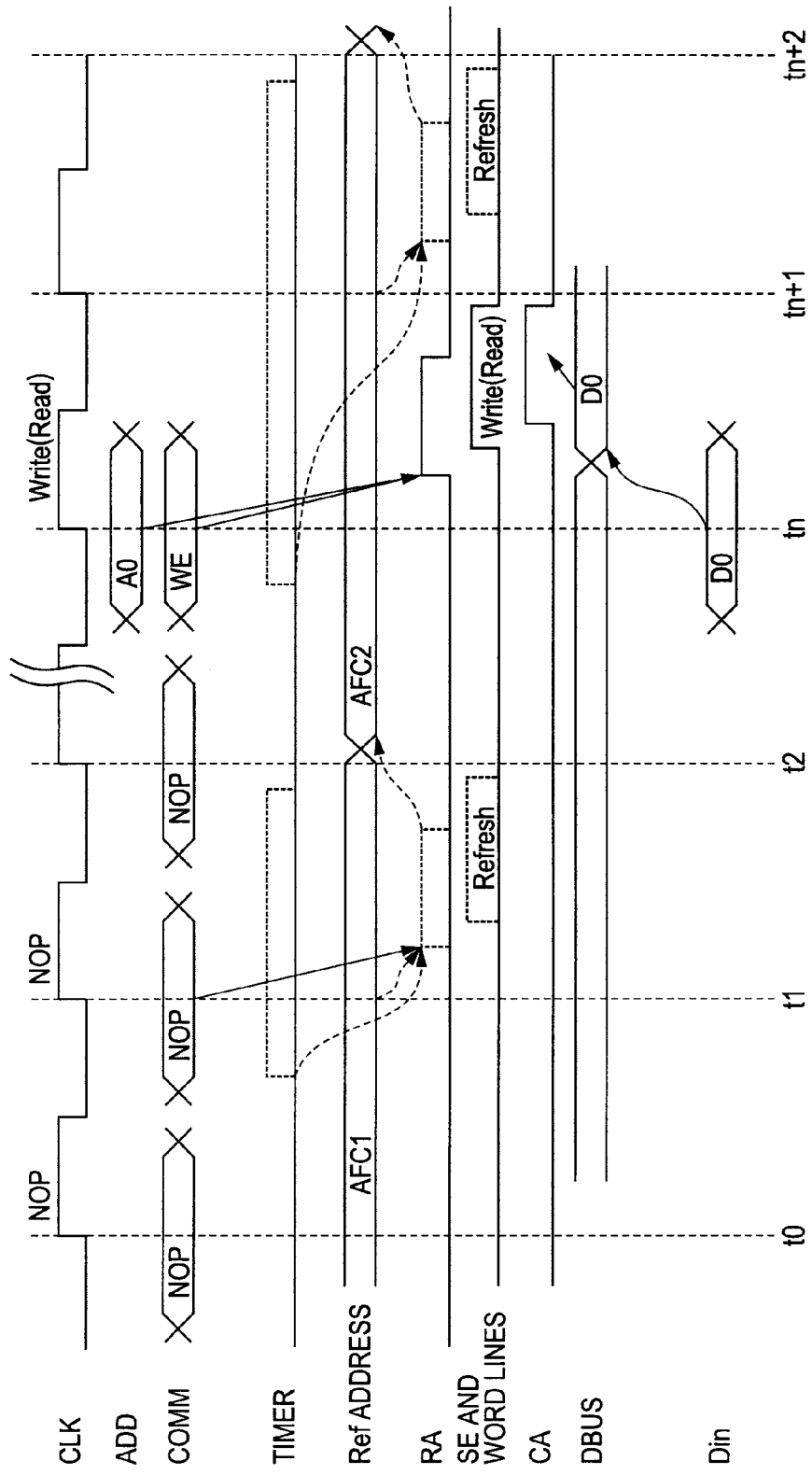
FIG. 9 is an operation waveform chart of the hidden-refresh operation in the semiconductor memory device of the related art.

FIG. 8 is a block diagram of the semiconductor device of the seventh embodiment. The semiconductor device 300 of FIG. 8 incorporates the semiconductor memory devices 100 (or 100A) described in any of the first through sixth embodiments and the data processing device 200 into the same semiconductor substrate as a one-chip semiconductor device. The semiconductor memory device 100 and the data processing device 200 are formed into the same semiconductor chip so the number of connecting terminals can be increased comparatively easily by utilizing multilayer wiring formed in the semiconductor substrate. Increasing the number of bits in the semiconductor memory device to match the size for the number of bits simultaneously required by the data processing device 200 causes increased power consumption in the data buses within the semiconductor memory device 100, and between the data processing device 200 and the semiconductor memory device 100. However this power consumption by the data buses can be lowered by utilizing the schedule control unit 21 within the semiconductor memory device 100 to perform hidden-refresh by making use of the period for data transfer between the data processing devices or within the semiconductor memory device 100 as already described in the first through the sixth embodiments.

Even in the case where an ECC circuit 19 was installed within the semiconductor memory device 100 to boost data retention reliability by lowering the voltage in the semiconductor memory device 100 to accompany the lowering of the voltage in the data processing device 200; the schedule control unit 21 within the semiconductor memory device 100 exerts control so as to perform the refresh operation in parallel with parity processing by the ECC circuit so that hidden-refresh can be performed without causing an increase in processing time by the ECC circuit.

The examples described in the first through the fourth embodiments described semiconductor memory devices using the synchronization method. The semiconductor memory device of the present invention is not necessarily limited to the synchronization method. For example a non-synchronous semiconductor memory device that performs the read operation or the write operation by supplying address and read/write signals from outside the semiconductor memory device, detecting changes in the address signals and utilizing the level of the read/write signals at that time. When applying the present invention to a non-synchronous semiconductor memory device in this way, control can be implemented so as to perform hidden-refresh along with the read operation and the write operation when the read request and the write request are within a fixed period; and perform self-refresh when there is no read request and no write request within a fixed period. The first through the seventh embodiments may also be combined in any optional combination regardless of whether the semiconductor memory device is synchronous or non-synchronous.

In the above embodiments, the case where the present invention was incorporated along with other functions as the system LSI onto one chip was mainly described as the example of the present invention rendering the greatest effect. However, the present invention is not necessarily limited to incorporation into one chip. In FIG. 8 for example, the semiconductor memory device 100 and the data processing device 200 were formed in separate semiconductor substrates as separate chips, and can also be applied to semiconductor devices as a system package where the entire invention is built into one package. The present invention is moreover not limited to incorporation into a system LSI, and is also effective when used as a standalone semiconductor memory device.

Changes and adjustments to the embodiments and working examples based on the basic technical concepts within the scope of the entire disclosure (including the range of the claims) of the present invention are also permissible. Moreover, varied elements of the disclosure may be utilized in all manner of combinations or selections within the scope of the claims of the present invention. Namely, the present invention may of course include variations and corrections of different types obtainable by one skilled in the art according to the full disclosure and technical concepts embodied by the range of the claims of this invention.

The present invention may be applied to a wide range of semiconductor devices containing plural memory cells requiring a refresh operation for retaining data such as in DRAM, etc.

What is claimed is:

1. A semiconductor memory device comprising:
a memory cell array including a plurality of memory cells required for refresh operation when retaining data;
a read/write control unit configured to perform read access or write access of memory cell addresses of memory cell arrays specified based on specifications from the outside:
a refresh control unit configured to perform hidden-refresh of the memory cells without control from the outside; and
a schedule control unit configured to make the refresh control unit perform hidden-refresh:
(i) only after the read/write access control unit has read-accessed the memory cell array if a hidden-refresh request overlaps a read access request, and
(ii) only before the read/write access control unit performs write access if a hidden-refresh request overlaps a write access request.

2. The semiconductor memory device according to claim 1, wherein the read/write control unit is configured to:
prepare for output of data read out from the memory cell array to the outside, in parallel with performing refresh operation in the memory cell array during read-access, and
prepare to write data onto the memory cell array, in parallel with performing the refresh operation in the memory cell array during write-access.

3. The semiconductor memory device according to claim 1, wherein the read/write control unit includes an ECC circuit, and
wherein the ECC circuit is configured to:
perform ECC processing of data read out from the memory cell array, in parallel with performing refresh operation in the memory cell array during read-access, and
perform ECC processing of data to write onto the memory cell array, in parallel with refresh operation performed in the memory cell array during write-access.

4. The semiconductor memory device according to claim 1, wherein the read/write control unit includes a serial/parallel converter circuit, and
wherein the serial/parallel converter circuit is configured to:
convert data read out in parallel from the memory cell array into serial data, in parallel with performing refresh operation on the memory cell array during read-access, and
convert data input serially from the outside into parallel data to write in the memory cell array, in parallel with performing refresh operation in the memory cell array during write-access.

5. The semiconductor memory device according to claim 1, wherein the read/write control unit includes an internal I/O bus to couple the external I/O buffer to the memory cell array,
wherein the read/write control unit is configured to:
transfer data read out from the memory cell array via the internal I/O bus to the external I/O buffer, in parallel with performing refresh operation in the memory cell array during read-access,
send data input from the external I/O buffer via the internal I/O bus to the memory cell array, in parallel with performing refresh operation in the memory cell array during write-access, and
wherein the internal I/O bus is any one of a bus coded so as to minimize the number of data transition bits, a low-amplitude bus, and a multi-value level bus.

6. The semiconductor memory device according to claim 1, further comprising a timer circuit configured to control the refresh operation,
wherein the schedule control unit is configured to perform control when the hidden-refresh operation based on the timer circuit overlaps the read-access or the write-access.

7. The semiconductor memory device according to claim 1, wherein the read/write control unit is configured to perform read-access or write-access while synchronized with a clock applied from the outside,
wherein the refresh control unit is configured to perform hidden-refresh while synchronized with the clock, and
wherein the schedule control unit is configured to perform scheduling when there is a conflict between the read-access or the write-access performed by the read/write control unit, and the hidden-refresh operation performed by the hidden-refresh control unit at the same edge of the clock.

8. The semiconductor memory device according to claim 1, comprising:
a semiconductor memory device for another product;
a jointly designed DRAM basic operation macro unit; and
a dedicated control macro unit uniquely designed for the applicable semiconductor memory device,
wherein the overall semiconductor memory device functions as a hidden-refresh DRAM.

9. A semiconductor device comprising:
the semiconductor memory device according to claim 1;
a data processing device configured to perform data processing utilizing the data stored in the semiconductor memory device, wherein the read/write control unit is configured to perform read-access or write-access based on instructions from the data processing device, and wherein the refresh control unit is configured to perform hidden-refresh without control from the data processing device.

10. The semiconductor device according to claim 9, wherein the semiconductor memory device and the data processing device are formed over the same semiconductor substrate.

11. The semiconductor device according to claim 1, wherein the schedule control unit consists of a sequencer.

12. A control method for a semiconductor memory device including a DRAM cell array having a hidden-refresh function based on an internal timer, the method comprising:

performing hidden-refresh only after data reading when there are overlapping hidden-refresh and data read requests from the outside; and performing data writing only after performing hidden-refresh when there are overlapping hidden-refresh and data write requests from the outside.

13. The control method for a semiconductor memory device according to claim 11, comprising:

performing hidden-refresh, the preparation operation for output of data read out from the DRAM cell array to the outside, or the preparation operation for writing data input from the outside to the DRAM cell array, all in parallel.

14. A semiconductor memory device comprising:

a memory cell array including a plurality of memory cells;

a read/write control unit configured to perform read access or write access to the memory cells based on an address signal;

a refresh control unit configured to perform hidden-refresh of the memory cells based on a hidden-refresh request without control from the outside;

a schedule control unit configured to receive the hidden-refresh request and an access request, and to make the refresh control unit perform hidden-refresh:

after the read/write control unit has read-accessed the memory cell array if the schedule control unit receives the access request indicating a read access request when the hidden-refresh request is input into the schedule control unit, and before the read/write control unit has write-accessed the memory cell array if the schedule control unit receives the access request indicating a write access request when the hidden-refresh request is input into the schedule control unit.

15. The semiconductor memory device according to claim 14, wherein the read/write control unit is configured to generate a column activation signal to activate the column of the memory cell array based on the address signal, a first period of time from the point when the read access request is input into the schedule control unit to the point when the column activation signal is activated is shorter than a second period of time from the point when the write access request is input into the schedule control unit to the point when the column activation signal is activated.

16. The semiconductor memory device according to claim 14, wherein the read/write control unit includes an ECC circuit, and wherein the ECC circuit is configured to:

perform ECC processing of data read out from the memory cell array, in parallel with refresh operation in the memory cell array during read-access, and perform ECC processing of data write onto the memory cell array, in parallel with refresh operation in the memory cell array during write-access.

* * * * *